United States Patent
Starkovich et al.

(10) Patent No.: US 9,736,923 B1
(45) Date of Patent: Aug. 15, 2017

(54) ALLOY BONDED GRAPHENE SHEETS FOR ENHANCED THERMAL SPREADERS

(71) Applicant: Northrop Grumman Systems Corporation, Falls Church, VA (US)

(72) Inventors: John A. Starkovich, Redondo Beach, CA (US); Jesse B. Tice, Torrance, CA (US); Xianglin Zeng, Monterey Park, CA (US); Andrew D. Kostelec, Fullerton, CA (US); Hsiao-Hu Peng, Rancho Palos Verdes, CA (US); Edward M. Silverman, Encino, CA (US)

(73) Assignee: Northrop Grumman Systems Corporation, Fall Church, VA (US)

( * ) Notice: Subject to any disclaimer, the term of this patent is extended or adjusted under 35 U.S.C. 154(b) by 0 days.

(21) Appl. No.: 15/407,299

(22) Filed: Jan. 17, 2017

(51) Int. Cl.
*H05K 1/02* (2006.01)
*F28F 21/02* (2006.01)

(52) U.S. Cl.
CPC ........... *H05K 1/0204* (2013.01); *F28F 21/02* (2013.01); *F28F 2255/06* (2013.01); *F28F 2275/02* (2013.01); *H05K 2201/06* (2013.01)

(58) Field of Classification Search
USPC ........................................ 174/252
See application file for complete search history.

(56) References Cited

U.S. PATENT DOCUMENTS

| | | | |
|---|---|---|---|
| 6,479,136 B1* | 11/2002 | Nakanishi | H05K 1/056 174/258 |
| 2014/0027161 A1* | 1/2014 | Lee | H05K 1/09 174/257 |
| 2014/0218867 A1* | 8/2014 | Kim | H05K 9/0088 361/704 |
| 2016/0057854 A1* | 2/2016 | Schneider | B32B 9/007 174/252 |

* cited by examiner

*Primary Examiner* — Timothy Thompson
*Assistant Examiner* — Michael F McAllister
(74) *Attorney, Agent, or Firm* — Patti & Malvone Law Group, LLC

(57) ABSTRACT

A heat spreader for printed wiring boards and a method of manufacture are disclosed. The heat spreader is made from a plurality of graphene sheets that are thermo-mechanically bonded using an alloy bonding process that forms a metal alloy layer using a low temperature and pressure that does not damage the graphene sheets. The resulting heat spreader has a higher thermal conductivity than graphene sheets alone.

15 Claims, 3 Drawing Sheets

ALLOY BONDED GRAPHENE SHEETS FOR ENHANCED THERMAL SPREADERS

STATEMENT OF GOVERNMENT RIGHTS

The Government of the United States of America has rights in this invention pursuant to Government Contract No. 11-C-0042.

BACKGROUND

The invention relates generally to heat dissipation electronic circuitry and more particularly to an improved thermal core material used as a heat spreader for printed wiring boards (PWBs) and other electrical and electronic assemblies.

Heat dissipation for electronic devices and components mounted on printed wiring boards (PWBs) having a low thermal conductivity (~0.3 W/mK) is a growing problem as device/component power consumption increases to meet escalating performance requirements. Metal-core printed wiring boards (MCPWBs) in which 900-3,500 µm (30-135 mil) thick copper or some other conductive metal sheet is embedded/laminated between glass-reinforced epoxy boards (for example G10 or FR-4) is a possible solution. The embedded conductive metal acts as a heat channel or spreader assisting heat distribution over a larger area for faster dissipation.

However, the use of such thick metal conductors like copper adds significant weight, approximately 7-30 kg/m$^2$ (22-100 oz/ft$^2$) to the PWB. For a typical 1.6 mm ($\frac{1}{16}$") thick G10 PWB this amounts to 2-10× increase in circuit board weight. The extra weight is a serious issue for weight-restricted air- and spacecraft electronic payload applications. There is strong incentive to use lighter weight thermal conducting core materials such as aluminum or graphene sheet. However these materials have other issues; aluminum has half the conductivity of copper so thicker sheet material is required and graphene sheet has anisotropic conductivity properties. In other words, while thermal conductivity in the x-y plane of a graphene sheet is typically $K_{xy}$200-500 W/mK and $K_z$ only 3-6 W/mK).

Thus, a need exists for heat spreading core materials for PWBs with improved thermal performance and lighter weight.

SUMMARY

The invention in one implementation encompasses a heat spreader with improved thermal performance at a lower weight and a process for its manufacture. The heat spreader is made from a plurality of graphene sheets that are thermo-mechanically bonded using an alloy bonding process that forms a metal alloy layer using a low temperature and pressure that does not damage the graphene sheets. The resulting heat spreader has a higher thermal conductivity than graphene sheets alone.

In an embodiment, the invention encompasses a printed wiring board (PWB) including a first PWB layer having an upper surface for attaching electrical components and a lower surface; a second PWB layer having upper and lower surfaces; and a thermal core material inserted between the lower surface of the first PWB and the upper surface of the second PWB, said thermal core material further comprising a plurality of graphene sheets thermo-mechanically bonded by a metal alloy.

In a further embodiments the metal alloy further includes a plurality of metal layers that have been thermo-mechanically bonded, where the plurality of layers may include, for example, a layer of gold (Au) and a layer of indium (In); a layer of gold (Au) and a layer of tin (Sn); a layer of indium (In) and a layer of tin (Sn); or a layer of copper (Cu) and a layer of indium (In).

In a further embodiment the thermal core material includes a first layer of titanium between the plurality of metal layers and the first graphene sheet and a second layer of titanium and a layer of molybdenum between the plurality of metal layers and the second graphene sheet.

In yet another embodiment, the PSB includes a layer of molybdenum (Mo) between the plurality of metal layers and one of the titanium layers.

In another embodiment, the invention encompasses a heat spreader for a printed wiring board including a first planar graphene sheet; a second planar graphene sheet; and a plurality of planar layers between said first and second planar graphene sheets, the plurality of planar layers thermo-mechanically bonded to form a metal alloy layer.

In an embodiment, the plurality of planar layers includes, for example, a layer of gold (Au) and a layer of indium (In); a layer of gold (Au) and a layer of tin (Sn); a layer of indium (In) and a layer of tin (Sn); or a layer of copper (Cu) and a layer of indium (In).

In a further embodiment, the plurality of planar layers includes a first layer of titanium between the metal alloy layer and the first graphene sheet and a second layer of titanium and a layer of molybdenum between the metal alloy layer and the second graphene sheet.

Another implementation of the invention encompasses a method of manufacturing a heat spreader for a printed wiring board, including the steps of preparing a first graphene sheet by depositing a layer of titanium (Ti) on an upper surface of the first graphene sheet; depositing a first layer of metal on the layer of Ti on the first graphene sheet; preparing second graphene sheet by depositing a layer of titanium (Ti) on an upper surface of the second graphene sheet; depositing a layer of molybdenum (Mo) on the layer of Ti on the second graphene sheet; depositing a second layer of metal on the layer of Mo; and joining the first and graphene sheets to each other by alloy bonding the first and second metal layers.

In another embodiment, the first metal layer is gold (Au) and the second metal layer is indium (In).

In another embodiment, the first metal layer is gold (Au) and the second metal layer is tin (Sn).

In another embodiment, the first metal layer is indium (In) and the second metal layer is tin (Sn).

In another embodiment, the first metal layer is copper (Cu) and the second metal layer is Indium (In).

In a further embodiment, the alloy bonding step includes a step of compressing the layers at a temperature between approximately 175 and 250° C. and a pressure between approximately 5 and 20 kPa.

In another embodiment, the alloy bonding step includes a step of compressing the layers at a temperature of approximately 200° C. and a pressure of approximately 7 kPa.

BRIEF DESCRIPTION OF THE DRAWINGS

Features of example implementations of the invention will become apparent from the description, the claims, and the accompanying drawings in which:

DETAILED DESCRIPTION

Reference will now be made in detail to one or more embodiments of the invention. While the invention will be described with respect to these embodiments, it should be understood that the invention is not limited to any particular embodiment. On the contrary, the invention includes alternatives, modifications, and equivalents as may come within the spirit and scope of the appended claims. Furthermore, in the following description, numerous specific details are set forth to provide a thorough understanding of the invention. The invention may be practiced without some or all of these specific details. In other instances, well-known structures and principles of operation have not been described in detail to avoid obscuring the invention.

This disclosure describes a thermal core material and process for joining a variable number of thin, high thermal conductivity graphene sheets to form a suitable thickness thermal core material that can be used as a heat spreader in printed wiring boards (PWB). The purpose of such thermal core/heat spreaders is to assist in heat removal from heat generating devices located on the PWB.

Figure 1:
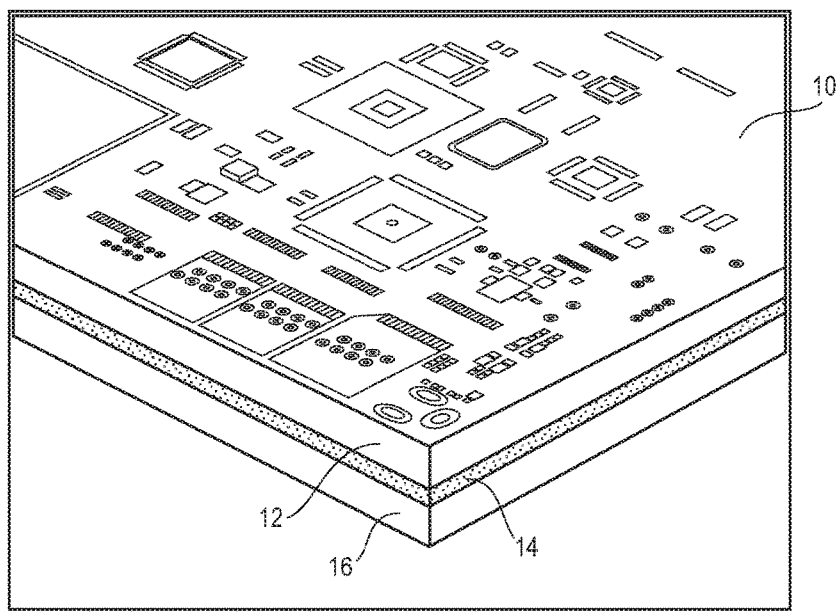
FIG. 1 is a representation of a printed wiring board (PWB) according to the present invention.

An embodiment of the present invention using two PWBs and a thermal core/heat spreader is illustrated in FIG. 1. PWB 10 is formed of PWBs 12 and 16 which are, for example, a fiberglass and resin composite such as G10 or FR-4. A variety of components are mounted on a surface of PWB 12 as would be understood by one of ordinary skill in the art. The components are diverse and generate differing amounts of heat. Therefore, the use of a heat spreading thermal core 14 helps disperse the heat horizontally and transfer it from the components on PWB 12 to PWB 16 and out to the edges of PWB 10.

Graphene-based thermal spreaders offer significant weight advantage over copper core heat spreaders. Graphene also is a better match with the thermal expansion properties of the materials most commonly used to make PWBs. Since the expansion and contraction of the layers of PWB 10 will be more closely matched, PWB 10 will experience lower thermo-mechanical stresses as well as less board warpage and distortion at elevated operating temperatures.

Figure 2:
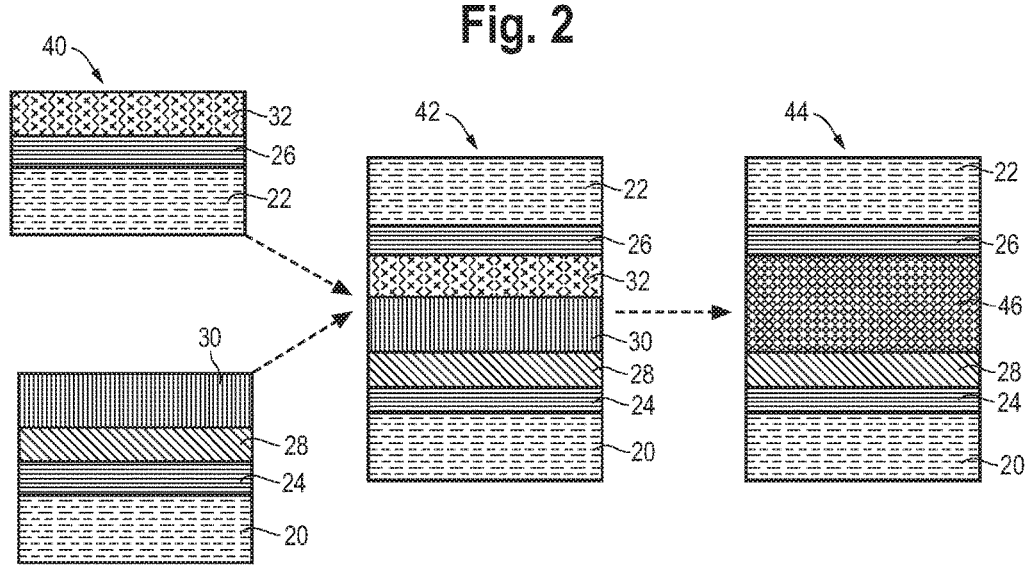
FIG. 2 is a representation of the process of manufacturing a heat spreader for a PWB according to the present invention.

The process of manufacturing the graphene sheet heat spreader 14 of FIG. 1 is shown schematically in FIG. 2. The various film and sheet thicknesses depicted in FIG. 2 are not drawn to scale.

In a first series of steps shown at 40, two graphene sheets 20 and 22 are provided. Although true graphene is generally understood to be a single layer of carbon atoms, in reality, a graphene sheet typically has between 1 and 20 layers of carbon atoms in a lattice structure. A thin layer 24, 26 of titanium is deposited on each of graphene sheets 20 and 22. This layer is approximately 200 to 600 Å (20-60 nm) thick and is used to cover any rough surfaces of the graphene sheet and improve adhesion of the graphene sheet to subsequent layers.

A layer 28 of molybdenum (Mo) is deposited on top of Ti layer 24. In an embodiment, Mo layer 28 is approximately 500 to 2000 Å (50-200 nm) thick. This layer further enhances adhesion, and also forms a barrier between Ti layer 24 and indium (In) layer 30. A layer 32 of gold (Au) is deposited on Ti layer 26.

The thicknesses of In layer 30 and Au layer 32 are flexible and should be chosen at the proper proportions to form an alloy of a desired thickness and composition. In an embodiment, In layer 30 is approximately 30,000 Å (3000 nm) thick and Au layer 32 is approximately 20,000 Å (2000 nm) thick. In an embodiment, bonding layers 30 and 32 should be thin as possible to reduce thermal impedance, but thick enough to cover any surface defects/asperities. Layers 30 and 32 should also have a uniform thickness for even heat distribution and transfer across the layer.

In a next step, represented at 42 in FIG. 2, the assembled layers 22, 26 and 32 are flipped and stacked on top of the assembled layers 20, 24, 28 and 30, then subjected to thermo-mechanical alloy brazing process. In an embodiment, layers 20, 24, 28, 30, 32, 26 and 22 are subjected to a bonding process during step 42 that creates an AuIn alloy layer 46 as shown at step 44. In an embodiment, the thermo-mechanical bonding process involves compressing the layers at approximately 200° C. and 7 kPa. In an alternative embodiment, the bonding process is performed at a range of temperatures from 175-250° C. and pressures from 5-20 kPa. The resulting AuIn layer 46 is approximately 5,000 Å (50 nm) thick. Although an alloy layer 46 of Au and In has been discussed above, alternative embodiments may use alloys of gold and tin (AuSn), indium and tin (InSn) and copper and indium (CuIn), for example.

The bonded sheet structure has significantly improved through-the-thickness ($K_z$) thermal conductivity. In an embodiment, an AuIn composition alloy according to the present invention demonstrated greater than 40% enhancement in $K_z$ conductivity over a single sheet of graphene. The bonding process is able to improve $K_z$ without damaging and diminishing the sheet material's in-plane ($K_{xy}$) conductivity.

Figure 3:
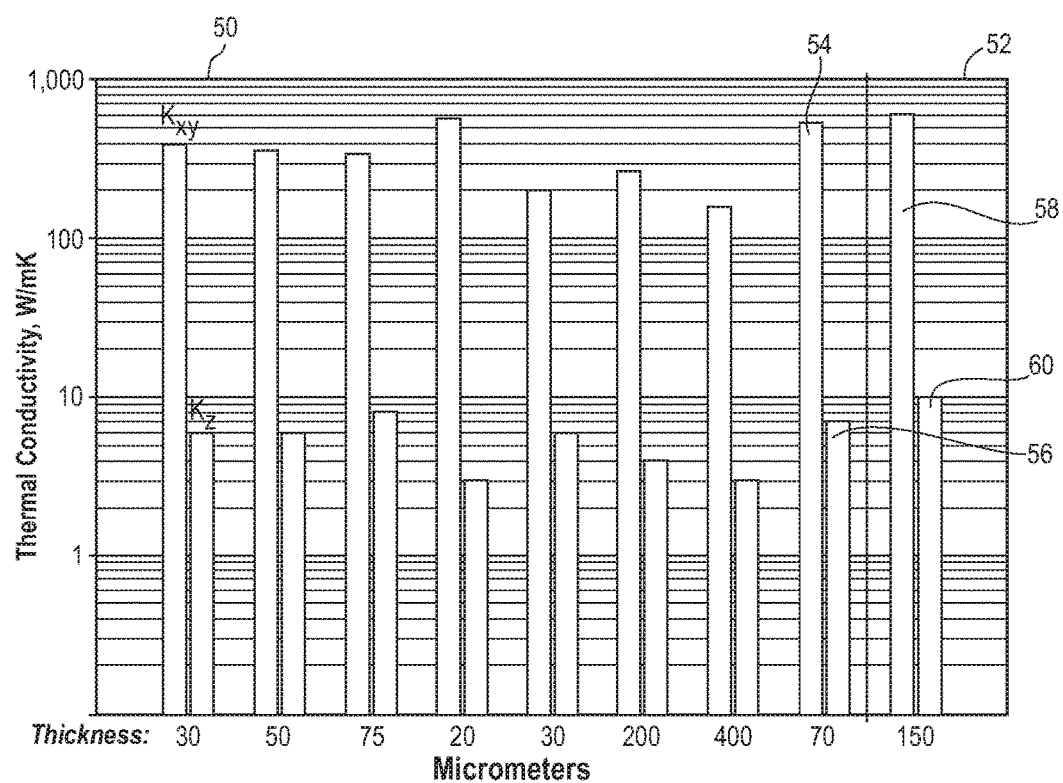
FIG. 3 is a graph of the thermal conductivity of various thicknesses of graphene sheets in comparison with the heat spreader of the present invention.

Maintenance of the conductivity of bonded graphene sheet using the alloy process can be seen from the barchart of FIG. 3. The barchart compares the thermal conductivity in W/mK to various thicknesses in micrometers of graphene sheets. The bars in section 50 of the chart depict $K_{xy}$ and $K_z$ of single unbonded graphene sheets. The bars in section 52 of the chart depict the thermal conductivity of bonded graphene sheets using the inventive method. Bars 54 and 56 depict a $K_{xy}$ of 500 W/mK and a $K_z$ of 7 W/mk for a 70 micrometer thick unbonded graphene sheet respectively. Bars 58 and 60 depict a $K_{xy}$ of 600 W/mK and a $K_z$ of 10 W/mK respectively for the same graphene sheets after the inventive bonding process, resulting in a total thickness of 150 micrometer. As shown, the thermal conductivity $K_z$ is improved significantly.

Alloy bonded graphene sheets can be advantageously exploited for fabricating lighter weight conductive core PWB needed for weight restricted air and spacecraft electronic payloads.

The inventive alloy brazing method allows for bonding difficult-to-join graphene sheets into thicker laminate structures which may be used as lightweight, low thermal expansion, high conductivity thermal heat spreaders. The alloy bonding process joins graphene sheets together with minimal surface preparation and is accomplished at low temperatures and pressures. The process does not physically damage the sheet material or cause it to distort and maintains or enhances its thermal conductivity.

Figure 4:
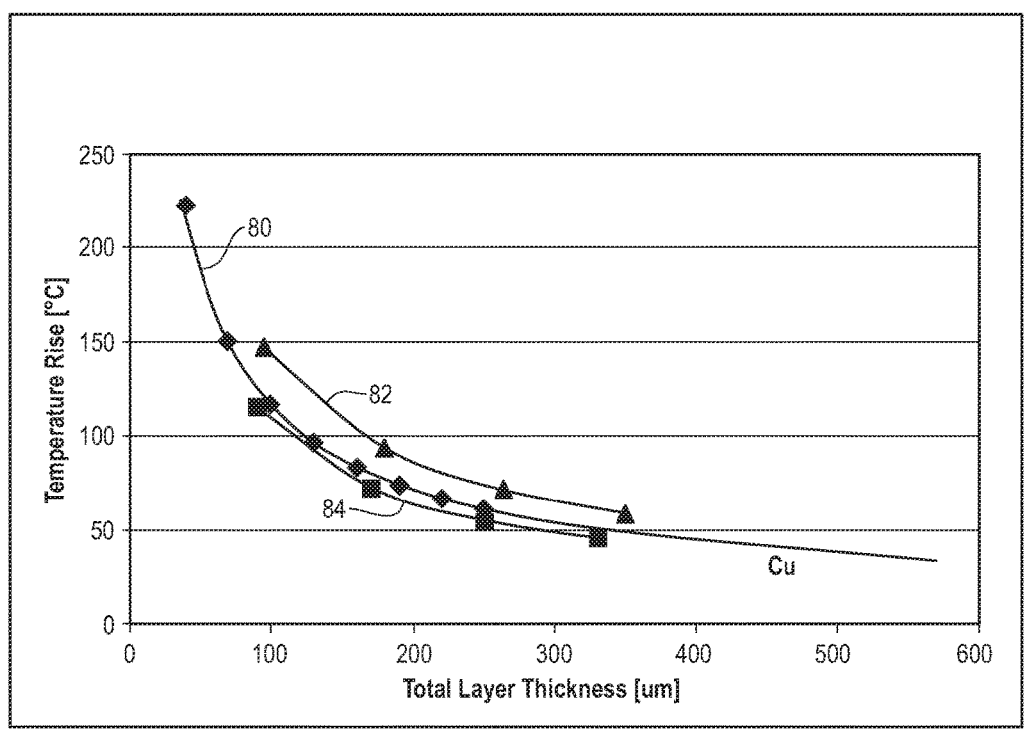
FIG. 4 is a graph of model predicted thermal performance for two bonded graphene heat spreaders of this invention.

As seen in FIG. 4, bonded graphene thermal core/heat spreaders incorporated in PWB offer the thermal performance of copper for safely managing junction temperatures of next generation devices at a fraction of the metal weight. FIG. 4 depicts the junction temperature comparisons for devices on a PWB with a variable thickness thermal core. In particular, FIG. 4 depicts predicted thermal performance for two alloy bonded graphene heat spreaders according to the present invention. For reference, line 80 depicts the performance of a copper heat spreader. Lines 82 and 84 depict the temperature across the various thicknesses of alloy bonded graphene sheet materials from two different suppliers.

If used and unless otherwise stated, the terms "upper," "lower," "front," "back," "over," "under," and similar such terms are not to be construed as limiting the invention to a particular orientation. Instead, these terms are used only on a relative basis.

The steps or operations described herein are just for example. There may be many variations to these steps or operations without departing from the spirit of the invention.

Although example implementations of the invention have been depicted and described in detail herein, it will be apparent to those skilled in the relevant art that various modifications, additions, substitutions, and the like can be made without departing from the spirit of the invention and these are therefore considered to be within the scope of the invention as defined in the following claims.

What is claimed is:

1. A printed wiring board (PWB), comprising:
   a first PWB layer having an upper surface for attaching electrical components and a lower surface;
   a second PWB layer having upper and lower surfaces; and
   a thermal core material inserted between the lower surface of the first PWB and the upper surface of the second PWB, said thermal core material further comprising first and second planar graphene sheets thermo-mechanically bonded by a metal alloy layer formed from a plurality of planar layers.

2. The PWB of claim 1, wherein metal alloy is further comprised by a plurality of metal layers that have been thermo-mechanically bonded.

3. The PWB of claim 2, wherein the plurality of metal layers further comprises a layer of gold (Au) and a layer of indium (In).

4. The PWB of claim 2, wherein the plurality of metal layers further comprises a layer of gold (Au) and a layer of tin (Sn).

5. The PWB of claim 2, wherein the plurality of metal layers further comprises a layer of indium (In) and a layer of tin (Sn).

6. The PWB of claim 2, wherein the plurality of metal layers further comprises a layer of copper (Cu) and a layer of indium (In).

7. The PWB of claim 2, wherein the thermal core material further comprises a first layer of titanium between the plurality of metal layers and the first graphene sheet and a second layer of titanium and a layer of molybdenum between the plurality of metal layers and the second graphene sheet.

8. The PWB of claim 7 further comprising a layer of molybdenum (Mo) between the plurality of metal layers and one of the titanium layers.

9. A heat spreader for a printed wiring board comprising:
   a first planar graphene sheet;
   a second planar graphene sheet; and
   a plurality of planar layers between said first and second planar graphene sheets, said plurality of planar layers thermo-mechanically bonded to form a metal alloy layer.

10. The heat spreader of claim 9, wherein the plurality of planar layers further comprises a layer of gold (Au) and a layer of indium (In) which are thermo-mechanically bonded to form the metal alloy layer.

11. The heat spreader of claim 10, wherein the plurality of planar layers further comprises a first layer of titanium between the metal alloy layer and the first graphene sheet and a second layer of titanium and a layer of molybdenum between the metal alloy layer and the second graphene sheet.

12. The heat spreader of claim 9, wherein the plurality of planar layers further comprises a layer of gold (Au) and a layer of tin (Sn).

13. The heat spreader of claim 9, wherein the plurality of planar layers further comprises a layer of indium (In) and a layer of tin (Sn).

14. The heat spreader of claim 9, wherein the plurality of planar layers further comprises a layer of copper (Cu) and a layer of indium (In).

15. The heat spreader of claim 11 further comprising a layer of molybdenum (Mo) between the plurality of metal alloy layer and one of the titanium layers.

\* \* \* \* \*